(12) United States Patent
He et al.

(10) Patent No.: US 9,674,982 B2
(45) Date of Patent: Jun. 6, 2017

(54) COOLING MODULE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Ting-Ting He, Wuhan (CN); Zhi-Ping Wu, Wuhan (CN)

(73) Assignees: HONG FU JIN PRECISON INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/691,283

(22) Filed: Apr. 20, 2015

(65) Prior Publication Data
US 2016/0219753 A1   Jul. 28, 2016

(30) Foreign Application Priority Data

Jan. 28, 2015   (CN) .......................... 2015 1 0042844

(51) Int. Cl.
| H05K 7/00 | (2006.01) |
| H05K 7/20 | (2006.01) |
| H01L 23/467 | (2006.01) |
| H01L 23/367 | (2006.01) |
| H01L 21/48 | (2006.01) |

(52) U.S. Cl.
CPC .............. *H05K 7/20* (2013.01); *H01L 23/467* (2013.01); *H01L 21/4882* (2013.01); *H01L 23/367* (2013.01)

(58) Field of Classification Search
None
See application file for complete search history.

(56) References Cited

U.S. PATENT DOCUMENTS

| 6,341,644 | B1 * | 1/2002 | Lo ....................... H01L 23/4093 165/80.3 |
| 6,940,716 | B1 * | 9/2005 | Korinsky .................. G06F 1/20 165/121 |
| 7,023,698 | B2 * | 4/2006 | Tung ................... H01L 23/4006 257/707 |
| 8,069,908 | B2 * | 12/2011 | Chen ..................... H01L 23/467 165/121 |
| 2006/0120045 | A1 * | 6/2006 | Van Der Werff ......... G06F 1/20 361/697 |
| 2006/0221570 | A1 * | 10/2006 | Yang ................... H01L 23/4093 361/697 |
| 2009/0159245 | A1 * | 6/2009 | Chen ..................... H01L 23/467 165/121 |

\* cited by examiner

*Primary Examiner* — Courtney Smith
*Assistant Examiner* — Zhengfu Feng
(74) *Attorney, Agent, or Firm* — Steven Reiss

(57) ABSTRACT

A cooling module is used to cool an electronic component, the cooling module includes a shell and a radiator which is received in the shell. The shell includes a receiving portion which is used to receive the radiator. Two sides of the receiving include two latch pieces, the latch piece defines a latch hole. Two sides of the radiator include two protrusive blocks, the latch piece can be elastically deformed to let the protrusive block be inserted into the latch hole to fix the radiator in the shell.

11 Claims, 4 Drawing Sheets

COOLING MODULE

CROSS-REFERENCE TO RELATED APPLICATIONS

This application claims priority to Chinese Patent Application No. 201510042844.7 filed on Jan. 28, 2015 in the China Intellectual Property Office, the contents of which are incorporated by reference herein.

FIELD

The subject matter herein generally relates to a cooling module, and more particularly to a cooling module for an electronic component.

BACKGROUND

A variety of electronic components, such as graphics processing unit (GPU) have become important in computer systems. In order to ensure the GPU operates normally, a cooling module is installed around the GPU for cooling the GPU.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
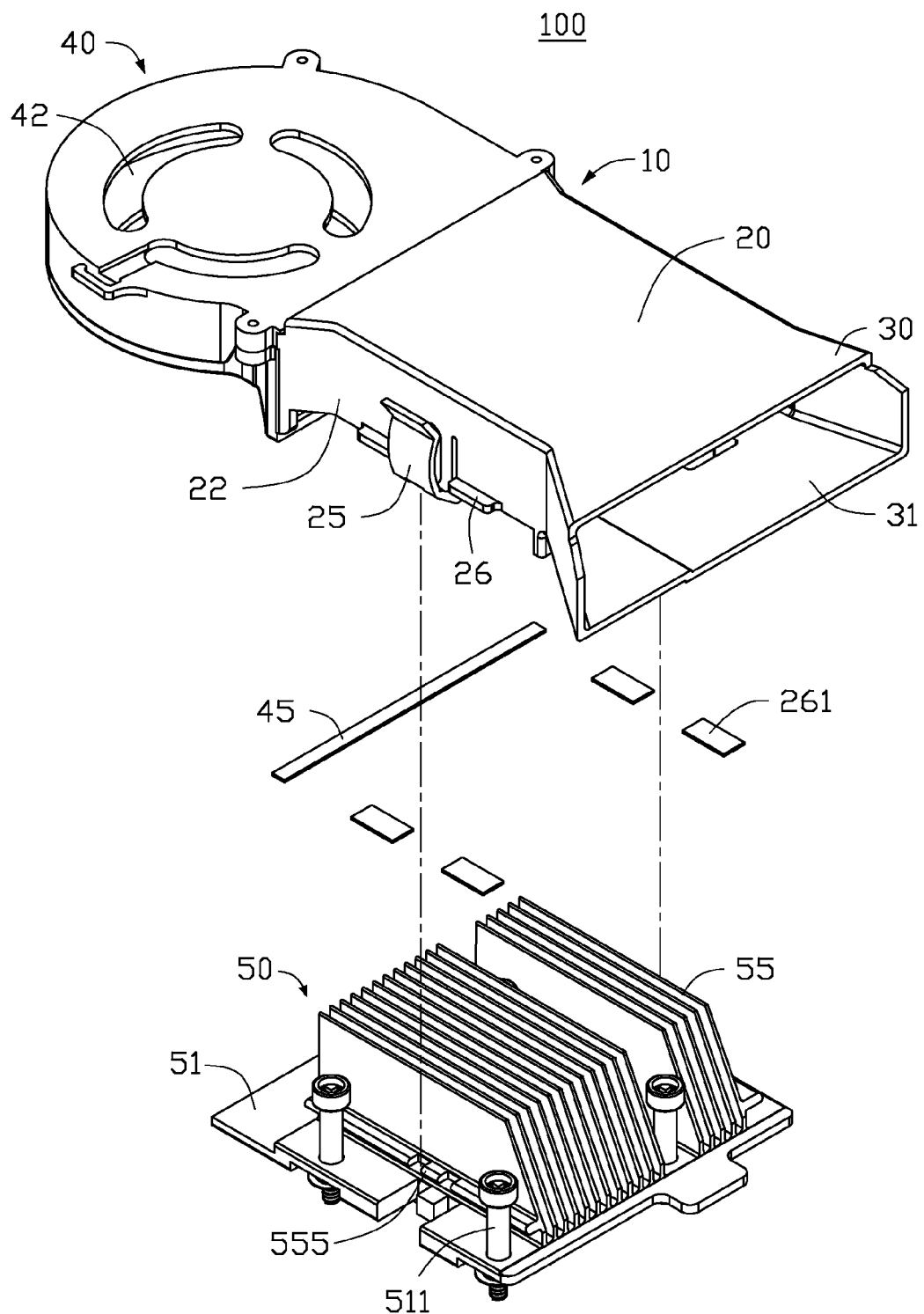
FIG. 1 is an exploded, isometric view of an embodiment of a cooling module.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

FIG. 1 illustrates one embodiment of a cooling module 100. The cooling module 100 is used to cool an electronic component (not shown). The cooling module 100 includes a shell 10 and a radiator 50 which is fixed in the shell 10.

Figure 2:
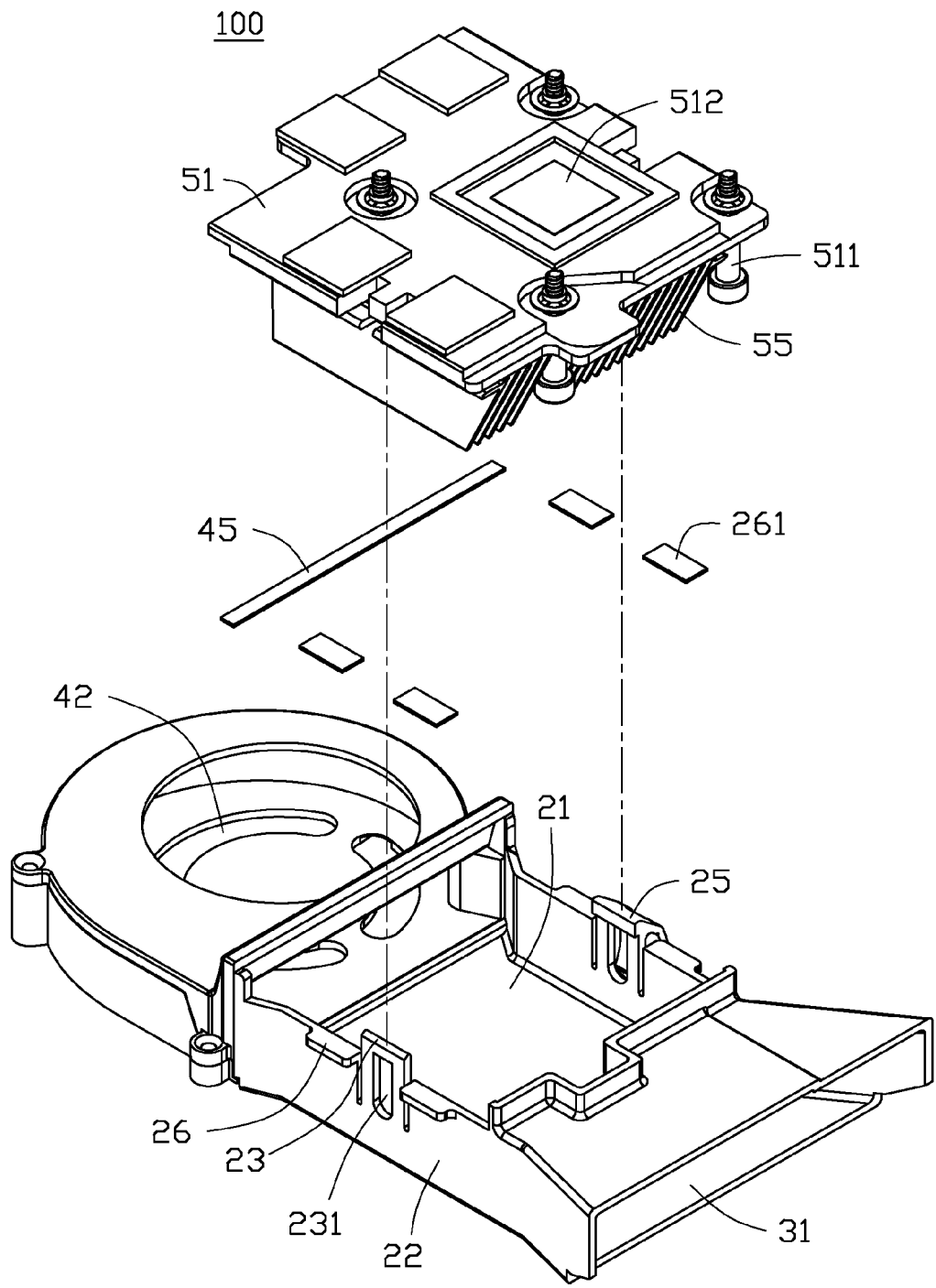
FIG. 2 is an exploded, isometric view of the cooling module of FIG. 1, but viewed from another aspect.

FIGS. 1 and 2 illustrate the shell 10 includes a receiving portion 20, an air guiding duct 30 which is connected with one end of the receiving portion 20 and a cooling portion 40 which is connected with another end of the receiving portion 20. The receiving portion 20 defines a receiving space 21 used to receive the radiator 50. Two sides of the receiving portion 20 include two baffles 22 which are parallel with each other. Each baffle 22 is equipped with a latch piece 23. The latch pieces 23 can be elastically deformed to be bent towards each other. The latch pieces 23 define a latch hole 231. The corresponding part of the radiator 50 can be inserted into the latch hole 231 to fix the radiator 50. A top portion of the one of the latch pieces 23 away from the receiving space 21 defines an operating handle 25. The operating handle 25 is pressed to bend the latch piece 23 into the receiving space 21. The baffle 22 is equipped with two platforms 26 at two sides of the latch piece 23. The platform 26 is mounted with a spacer 261, and the spacer 261 is configured to buffer the radiator 50 for protection.

The air guiding duct 30 defines an opening 31. The airflow can pass through the opening 31 to enter into the radiator 50. The cooling portion 40 includes a cooling fan (not shown) and defines a plurality of vents 42. The airflow can exhaust from the vent 42 after passing through the radiator 50. The cooling portion 40 adjacent the receiving portion 20 is equipped with a buffer strip 45. The buffer strip 45 is configured to buffer the radiator 50 for protection.

The radiator 50 includes a base plate 51 and a plurality of fins 55 which are parallel and fixed on the base plate 51. The base plate 51 is equipped with a plurality of fixing pieces 511. The fixing pieces 511 can be mounted on a motherboard (not shown) to fix the cooling module 100 on the motherboard. One side away from the fin 55 of the base plate 51 is equipped with an endothermic piece 512. The endothermic piece 512 can be closely contacted with the electronic component to absorb heat from the electronic component. The bottom of the fins 55 near the both ends are equipped with two protrusion blocks 555, the protrusion blocks 555 are inserted into the latch hole 231 of the latch piece 23 to fix the radiator 50 in the shell 10.

Figure 3:
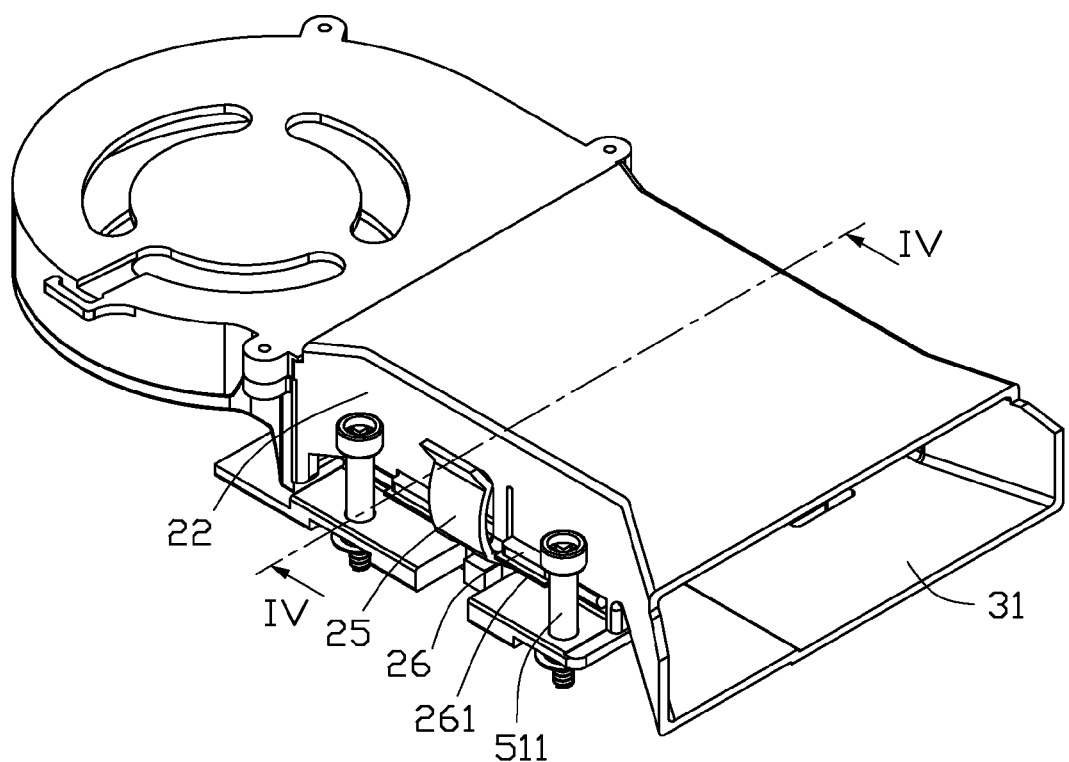
FIG. 3 is an assembled, isometric view of the cooling module of FIG. 1.
Figure 4:
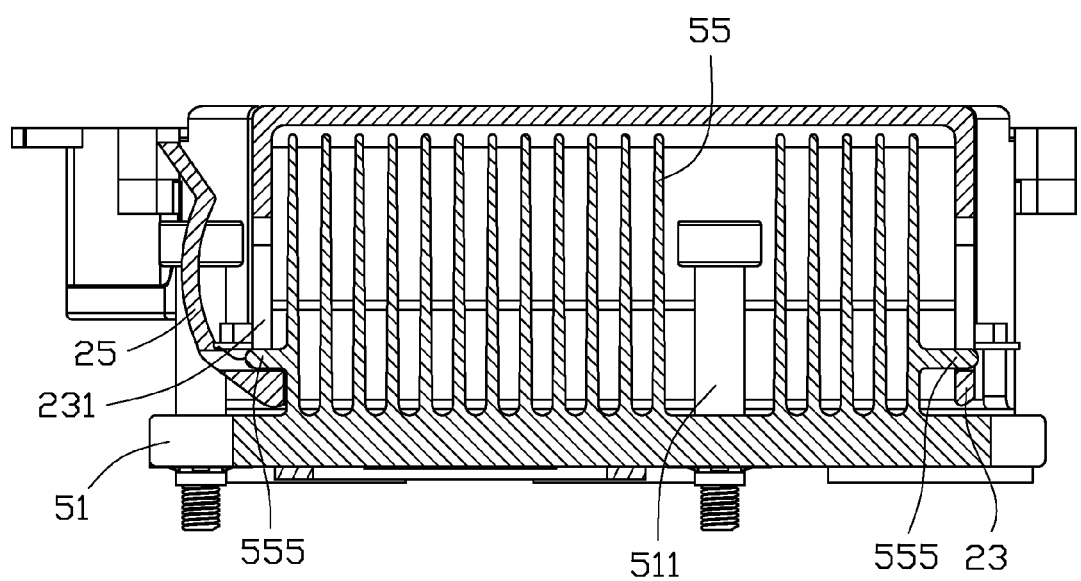
FIG. 4 is a cross sectional view of the cooling module along a line IV-IV of FIG. 3.

FIGS. 3 and 4 illustrate that in assembly, the spacer 261 is fixed on the platform 26 and the buffer strip 45 is fixed on the cooling portion 40. The radiator 50 is placed in the receiving portion 20 of the shell 10. The fin 55 is received in the receiving space 21. The operating handle 25 of one of the latch pieces 23 is pressed allowing the latch piece 23 to bend away from the receiving space 21. The radiator 50 is pushed and the protrusive block 555 is pressed on the two latch pieces 23 until the protrusive block 555 is inserted into the latch hole 231. The operating handle 25 is loosened and two latch pieces are elastically recovered to fix the radiator 50 in the shell 10. The spacer 261 and the buffer strip 45 are received between the shell 10 and the radiator 50. The spacer 261 and the buffer strip 45 are used to buffer and to protect the radiator 50. Then, the cooling module 100 is completely assembled. When the cooling module 100 needs to be used, the fixing piece 511 of the cooling module 100 is fixed on the motherboard to fix the cooling module 100 to the motherboard. Then, the cooling module 100 can cool the electronic component of the motherboard.

It is to be understood, however, that even though numerous characteristics and advantages of the embodiments have been set forth in the foregoing description, together with details of the structure and functions of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A cooling module used to cool an electronic component, comprising:
a shell comprising a receiving portion, two sides of the receiving portion comprising two latch pieces, each latch piece defining a latch hole; and
a radiator, two sides of the radiator comprising two protrusive blocks;
wherein the latch piece is elastically deformed when the protrusive block is inserted into the latch hole to fix the radiator in the shell, the receiving portion defines a receiving space to receive the radiator, the receiving portion comprises two baffles which are paralleled to each other at the two sides of the receiving space, the latch piece is fixed on one of the two baffles, one end of the one of latch pieces comprises an operating handle, the operating handle elastically bends the latch piece outwardly to let the protrusive block insert into the latch hole of the latch piece, each baffle comprises two platforms at the two sides of the latch piece, each platform comprise a spacer, the spacer is used to protect the radiator.

2. The cooling module of claim 1, wherein the radiator comprises a base plate, the base plate comprises a plurality of the fixing pieces, the fixing pieces are mounted on a motherboard to fix the cooling module.

3. The cooling module of claim 2, wherein one side of the base plate comprises an endothermic piece, the endothermic piece is closely contacted with the electronic component to absorb the quantity of heat of the electronic component.

4. The cooling module of claim 3, wherein the radiator further comprises a plurality of parallel fins which are fixed on another side of the base plate, the protrusive blocks are defined on both ends of the radiator.

5. The cooling module of claim 1, wherein the shell comprises an air guiding duct which is connected with the receiving portion, the air guiding duct defines an opening, the airflow can pass through the opening to enter into the cooling module.

6. The cooling module of claim 1, wherein the shell further comprises a cooling portion which is connected with the receiving portion, the cooling portion comprises a cooling fan, the cooling fan is used to cool the radiator.

7. An electronic device combination, comprising:
an electronic component; and
a cooling module used to cool the electronic component, the cooling module comprising a shell and a radiator received in the shell, the shell comprising a receiving portion, two sides of the receiving portion comprising two latch pieces, the latch piece defining a latch hole; two sides of the radiator comprising two protrusive blocks;
wherein the latch piece is elastically deformed when the protrusive block is inserted into the latch hole to fix the radiator in the shell, the receiving portion defines a receiving space to receive the radiator, the receiving portion comprises two baffles which are paralleled to each other at the two sides of the receiving space, the latch piece is fixed on one of the two baffles, one end of the one of latch pieces comprises an operating handle, the operating handle elastically bends the latch piece outwardly to let the protrusive block insert into the latch hole of the latch piece, each baffle comprises two platforms at the two sides of the latch piece, each platform comprise a spacer, the spacer is used to protect the radiator.

8. The electronic device combination of claim 7, wherein the radiator comprises a base plate, the base plate comprises a plurality of the fixing pieces, the fixing pieces are mounted on a motherboard to fix the cooling module.

9. The electronic device combination of claim 8, wherein one side of the base plate comprises an endothermic piece, the endothermic piece is closely contacted with the electronic component to absorb the quantity of heat of the electronic component.

10. The electronic device combination of claim 9, wherein the radiator further comprises a plurality of parallel fins which are fixed on another side of the base plate, the protrusive blocks are defined on both ends of the radiator.

11. The electronic device combination of claim 7, wherein the shell comprises an air guiding duct which is connected with the receiving portion, the air guiding duct defines an opening, the airflow can pass through the opening to enter into the cooling module.

* * * * *